(12) United States Patent
Ebert et al.

(10) Patent No.: US 9,891,540 B2
(45) Date of Patent: Feb. 13, 2018

(54) MEASURING METHOD, MEASUREMENT APPARATUS, LITHOGRAPHIC APPARATUS AND DEVICE MANUFACTURING METHOD

(71) Applicants: ASML HOLDING N.V., Veldhoven (NL); ASML NETHERLANDS B.V., Veldhoven (NL)

(72) Inventors: Earl William Ebert, Wilton, CT (US); Franciscus Godefridus Casper Bijnen, Veldhoven (NL)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/504,621

(22) PCT Filed: May 29, 2015

(86) PCT No.: PCT/EP2015/061928
§ 371 (c)(1),
(2) Date: Feb. 16, 2017

(87) PCT Pub. No.: WO2016/030031
PCT Pub. Date: Mar. 3, 2016

(65) Prior Publication Data
US 2017/0235230 A1 Aug. 17, 2017

Related U.S. Application Data

(60) Provisional application No. 62/041,518, filed on Aug. 25, 2014.

(51) Int. Cl.
*G03B 27/54* (2006.01)
*G03F 7/20* (2006.01)
(Continued)

(52) U.S. Cl.
CPC ............ *G03F 7/7085* (2013.01); *G01B 11/14* (2013.01); *G03F 9/7088* (2013.01)

(58) Field of Classification Search
CPC ......... G03F 7/7085; G03F 7/701; G03F 7/706
(Continued)

(56) References Cited

U.S. PATENT DOCUMENTS

| 5,481,362 A | 1/1996 | Van Den Brink et al. |
| 6,961,116 B2 | 11/2005 | Den Boef et al. |

(Continued)

FOREIGN PATENT DOCUMENTS

| CN | 103175468 | 6/2013 |
| EP | 0 467 445 | 1/1992 |

(Continued)

OTHER PUBLICATIONS

International Search Report and Written Opinion dated Sep. 25, 2015 in corresponding International Patent Application No. PCT/EP2015/061928.

*Primary Examiner* — Hung Henry Nguyen
(74) *Attorney, Agent, or Firm* — Pillsbury Winthrop Shaw Pittman LLP (57) ABSTRACT

A measurement apparatus including an optical system to provide illumination radiation into a spot on a periodic structure and to receive radiation redirected by the periodic structure, the optical system including a first stop to block zero order radiation from the periodic structure and allow non-zero order radiation to pass, and a second stop to block zero order radiation passing the first stop and to allow the non-zero order radiation to pass, and a radiation detector, downstream of the optical system, to receive the non-zero order radiation.

24 Claims, 7 Drawing Sheets

(51) Int. Cl.
*G03F 9/00* (2006.01)
*G01B 11/14* (2006.01)

(58) Field of Classification Search
USPC .................................. 355/52, 53, 55, 67–71
See application file for complete search history.

(56) References Cited

U.S. PATENT DOCUMENTS

| | | |
|---|---|---|
| 8,208,121 B2 | 6/2012 | Bijnen et al. |
| 8,593,646 B2 | 11/2013 | Den Boef et al. |
| 2005/0176979 A1 | 8/2005 | Stichter et al. |
| 2007/0177123 A1* | 8/2007 | Tel ..................... G03B 27/42 |
| | | 355/69 |
| 2009/0195768 A1 | 8/2009 | Bijnen et al. |
| 2015/0109624 A1* | 4/2015 | Kreuzer ............... G03F 9/7069 |
| | | 356/508 |
| 2015/0176979 A1 | 6/2015 | Mathijssen et al. |

FOREIGN PATENT DOCUMENTS

| | | |
|---|---|---|
| EP | 0 823 667 | 2/1998 |
| WO | 2013/152878 | 10/2013 |
| WO | 2014/026819 | 2/2014 |

\* cited by examiner

MEASURING METHOD, MEASUREMENT APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/061928, which was filed on May 29, 2015, which claims the benefit of priority of to U.S. Provisional Patent Application No. 62/041,518, filed Aug. 25, 2014, which is incorporated by reference herein in its entirety.

FIELD

The present invention relates to measurement of microstructures. The present invention may be embodied in an improved apparatus and method to measure marks on a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, one or more alignment marks are generally provided on the substrate, and the lithographic apparatus includes one or more alignment sensors by which positions of the marks on a substrate are accurately measured. The alignment sensor is effectively a position measurement apparatus. Different types of marks and different types of alignment sensors are known from different times and different manufacturers. A type of sensor widely used in current lithographic apparatus is based on a self-referencing interferometer as described in U.S. Pat. No. 6,961,116, which is incorporated herein in its entirety by reference. Generally, marks are measured separately to obtain X- and Y-positions. However, a combined X- and Y-measurement can be performed using a technique described in U.S. Patent Application Publication No. US 2009/195768, which is incorporated herein in its entirety by reference.

SUMMARY

There is continually a desire to provide more accurate position measurements, especially to control overlay error as product features get smaller and smaller. One cause of error in alignment is noise in the radiation signal and detection of radiation that does not carry alignment information.

Accordingly, it is desirable, for example, to provide a method and apparatus to reduce, if not eliminate, certain noise and reduce, if not eliminate, detection of radiation that does not carry alignment information.

According to an embodiment, there is provided a measurement apparatus comprising:
an optical system to provide radiation into a spot on a periodic structure and to receive radiation redirected by the periodic structure, the optical system comprising:
a first stop to block zero order radiation from the periodic structure and allow non-zero order radiation to pass, and
a second stop to block zero order radiation passing the first stop and to allow the non-zero order radiation to pass; and
a radiation detector, downstream of the optical system, to receive the non-zero order radiation.

According to an embodiment, there is provided a lithographic apparatus comprising:
a patterning subsystem configured to transfer a pattern to a substrate;
a measuring subsystem configured to measure a position of the substrate in relation to the patterning subsystem, wherein the patterning subsystem is arranged to use the position measured by the measuring subsystem to apply the pattern at a desired position on the substrate and wherein the measuring subsystem includes a measuring apparatus as described herein.

According to an embodiment, there is provided a method of measuring, the method comprising:
providing radiation into a spot on a periodic structure;
receiving radiation redirected by the periodic structure, the redirected radiation including zero order and non-zero order radiation;
blocking zero order radiation of the redirected radiation using a first stop, while allowing non-zero order radiation to pass the first stop;
blocking zero order radiation passing the first stop using a second stop, while allowing non-zero order radiation to pass the second stop; and
receiving the non-zero order radiation at a radiation detector downstream of the first and second stops.

According to an embodiment, there is provided a method of manufacturing a device wherein a device pattern is applied to a substrate using a lithographic process, the method including positioning the applied pattern by reference to a measured position of one or more periodic structures formed on the substrate, the measured position obtained by a method as described herein.

BRIEF DESCRIPTION OF THE DRAWINGS

Embodiments of the invention will now be described, by way of example only, with reference to the accompanying schematic drawings in which:

FIG. 2, comprising

FIG. 4, comprising

FIG. 5, comprising

DETAILED DESCRIPTION

Figure 1:
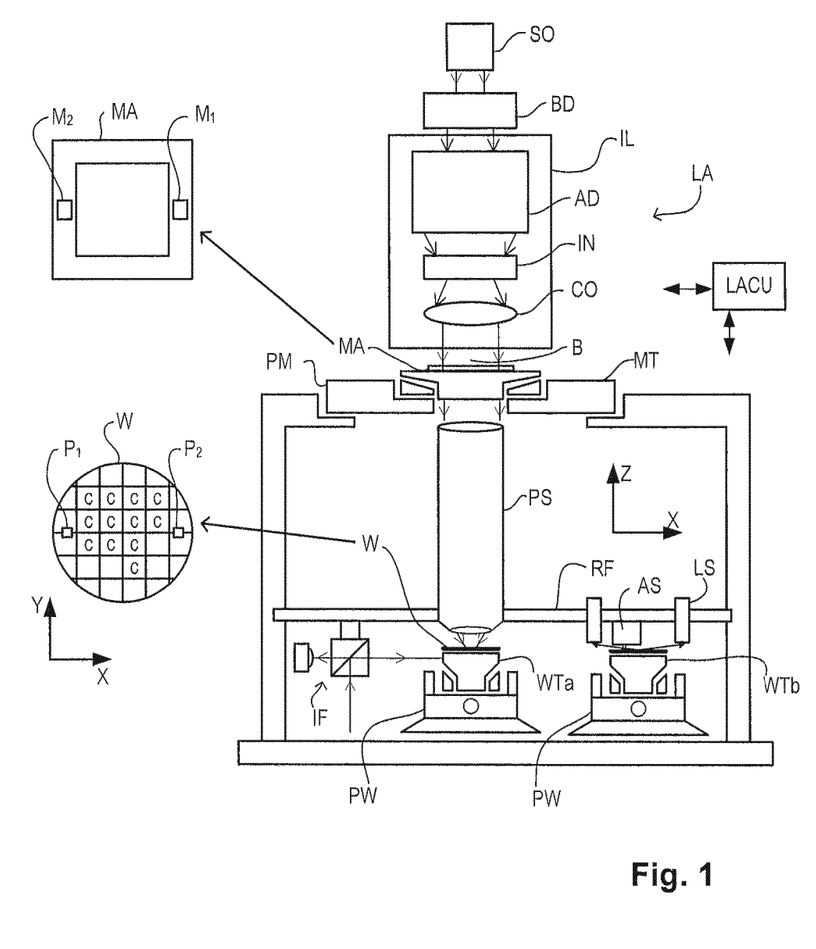
FIG. 1 depicts an exemplary lithographic apparatus including a measurement apparatus in the form of an alignment sensor according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., support structure MT), and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:
1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA may be a so-called multi-stage type apparatus which has at least two tables WTa and WTb and at least two stations—e.g., an exposure station and a measurement station—between which the tables can be exchanged. For example, where there at least two substrate tables WTa and WTb, while one substrate on one substrate table is being exposed at the exposure station, another substrate is provided at the other substrate table (e.g., loaded onto the other substrate table) at the measurement station so that various preparatory steps may be carried out. The preparatory steps may include mapping the surface of the substrate using a level sensor LS and/or measuring the position of one or more alignment markers on the substrate using an alignment sensor AS. This can enable a substantial increase in the throughput of the apparatus. Where at least one table is a substrate table and at least one other table is a measurement table, while the substrate on one substrate table is being unloaded or otherwise processed, the measurement table may be used at the exposure location to, e.g., measure the projection system. Or, when the substrate on the substrate table is being exposed at the exposure location, the measurement table may be used for one or more processing steps. If the position sensor IF is not capable of measuring the position of the substrate table while it is at the measurement station as well as at the exposure station, a second position sensor may be provided to enable the positions of the substrate table to be tracked at both stations.

The apparatus includes a lithographic apparatus control unit LACU which controls movements and measurements of various actuators and sensors described herein. The control unit LACU includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2A:
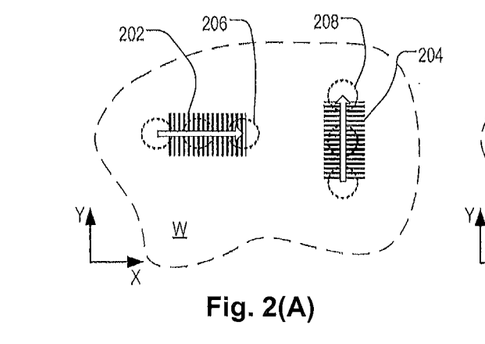
FIG. 2(A) and FIG. 2(B), illustrates various forms of an alignment mark that may be provided on, for example, a substrate or substrate table in the apparatus of FIG. 1.

FIG. 2(A) shows examples of alignment marks 202, 204, provided on, e.g., substrate W for the measurement of X-position and Y-position, respectively. Each mark in this example comprises a series of bars formed in a product layer or other layer applied to or etched into the substrate. The bars are regularly spaced and act as grating lines so that the mark can be regarded as a diffraction grating with a known spatial period (pitch). The bars on the X-direction mark 202 are parallel to the Y-axis to provide periodicity in the X-direction, while the bars of the Y-direction mark 204 are parallel to the X-axis to provide periodicity in the Y-direction. The alignment sensor AS (shown in FIG. 1) scans each mark optically with a spot 206, 208 of radiation, to obtain a periodically-varying signal, such as a sine wave. The phase of this signal is analyzed, to measure the position of the mark, and hence of substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are known to the person skilled in the art, and will not be detailed herein.

Figure 2B:
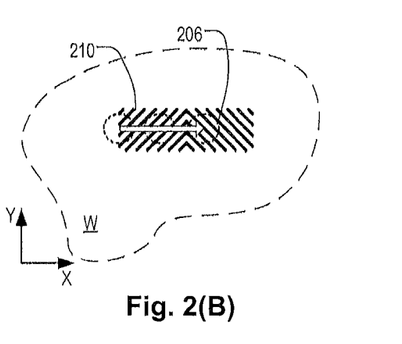

FIG. 2(B) shows a modified mark for use with a similar alignment system, by which X- and Y-positions can be obtained through a single optical scan with the illumination spot 206. The mark 210 has bars arranged at 45 degrees to both the X- and Y-axes. This combined X- and Y-measurement can be performed using the techniques described in, e.g., U.S. Patent Application Publication No. US 2009/195768.

The design and operation of various measurement apparatus, e.g., alignment apparatus, is known in the art, and each lithographic apparatus may have its own design of measurement apparatus. For the purpose of the present description, an embodiment of the invention will be described with respect to a measurement apparatus in the form of an alignment sensor AS that is generally of the form described in U.S. Pat. No. 6,961,116. However, an embodiment of the invention may be applied to other measurement apparatus.

Figure 3:
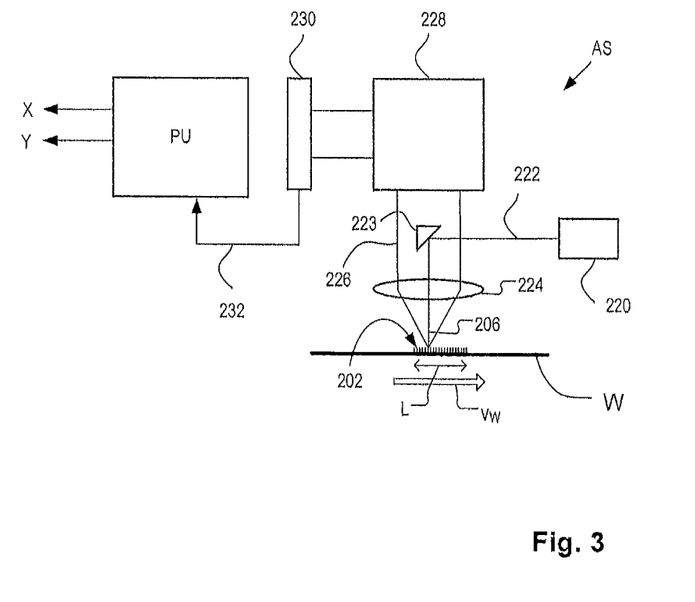
FIG. 3 is a schematic block diagram of a measurement apparatus in the form of an alignment sensor scanning an alignment mark in the apparatus of FIG. 1.

FIG. 3 is a schematic block diagram of a measurement apparatus in the form of an alignment sensor AS. Illumination input 220 provides a beam 222 of radiation of one or more wavelengths. In an embodiment, the illumination input 220 may be a source of the radiation (e.g., a laser) or be an inlet connected to a source of the radiation. The radiation from the illumination input is diverted by a spot mirror 223 through an objective lens 224 onto a mark, such as mark 202, located on substrate W. As indicated schematically in FIG. 2, in the example of the present alignment sensor, illumination spot 206 by which the mark 202 is illuminated may be slightly smaller in width than the width of the mark itself.

Radiation scattered by mark 202 is picked up by objective lens 224 and collimated into an information-carrying beam 226. A self-referencing interferometer 228 is of the type disclosed in U.S. Pat. No. 6,961,116, mentioned above and processes beam 226 and outputs separate beams onto a sensor array 230. In an embodiment, the system to process the information-carry beam 226 may be different than the self-referencing interferometer 228 and sensor array 230.

Spot mirror 223 serves conveniently as a zero order stop to block zero order radiation from the information-carry beam 226, so that the information-carrying beam 226 provided to the sensor array comprises higher order diffracted radiation from the mark 202. This improves the signal to noise ratio. In an embodiment, the spot mirror 223 need not be in the optical path of the information-carry beam 226 and thus a zero order stop may be separately provided.

Intensity signals 232 from individual sensors in sensor grid 230 are provided to a processing unit PU. By a combination of the optical processing in the block 228 and the computational processing in the unit PU, values for X- and Y-position of the mark 202 relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the mark within a certain range corresponding to one pitch of the mark. Coarser measurement techniques are used in conjunction with this to identify which period of the sine wave is the one containing the marked position. The same process at coarser and/or finer levels can be repeated at different wavelengths for increased accuracy, and for robust detection of the mark irrespective of the materials from which the mark is made, and on and/or below which it sits. The wavelengths can be multiplexed and demultiplexed optically so as to be processed simultaneously, and/or they may be multiplexed by time division or frequency division.

Referring to the measurement process in more detail, an arrow labeled $v_W$ in FIG. 3 illustrates a scanning velocity with which spot 206 traverses the length L of mark 202. In this example, the alignment sensor AS and spot 206 in reality remain stationary, while it is the substrate W that moves with velocity $v_W$. The alignment sensor can thus be mounted rigidly and accurately to the reference frame RF (FIG. 1), while effectively scanning the mark 202 in a direction opposite to the direction of movement of substrate W. The substrate is controlled in this movement by its mounting on the substrate table WT and the substrate positioning system PW. As discussed in U.S. Pat. No. 8,593,646, which is incorporated herein its entirety by reference, high productivity requirements of the lithographic apparatus involve the measurement of the alignment marks at numerous positions to be performed as quickly as possible, which implies that the scanning velocity $v_W$ is fast, and the time $T_{ACQ}$ available for acquisition of each mark position is correspondingly short. In simplistic terms, the formula $T_{ACQ}=L/v_W$ applies. U.S. Pat. No. 8,593,646 describes a technique to impart an opposite scanning motion of the spot, so as to lengthen the acquisition time. The same scanning spot techniques can be applied in sensors and methods of the type disclosed herein, if desired.

As discussed above, in an embodiment, an alignment sensor system may illuminate a mark 202 (e.g., a diffraction grating fiducial) with an illumination beam 222 by way of a spot mirror 223. That is, the illumination beam 222 is redirected by the spot mirror 223 towards the mark 202 where the illumination beam is diffracted into plus and minus orders of information-carrying beam 226. In addition to these plus and minus orders, a zeroth order is redirected (e.g., reflected) back along substantially the same direction as the incident illumination beam on the mark 202. The plus and minus orders pass by, on either side of the spot mirror 223, to be used by the remainder of the alignment sensor system. Zeroth order radiation from the mark 202 is redirected by the spot mirror 223 back toward the source of the illumination beam 222. Accordingly, the spot mirror 223 acts a stop for zeroth order radiation.

Figures 4A, 4B, 4C:
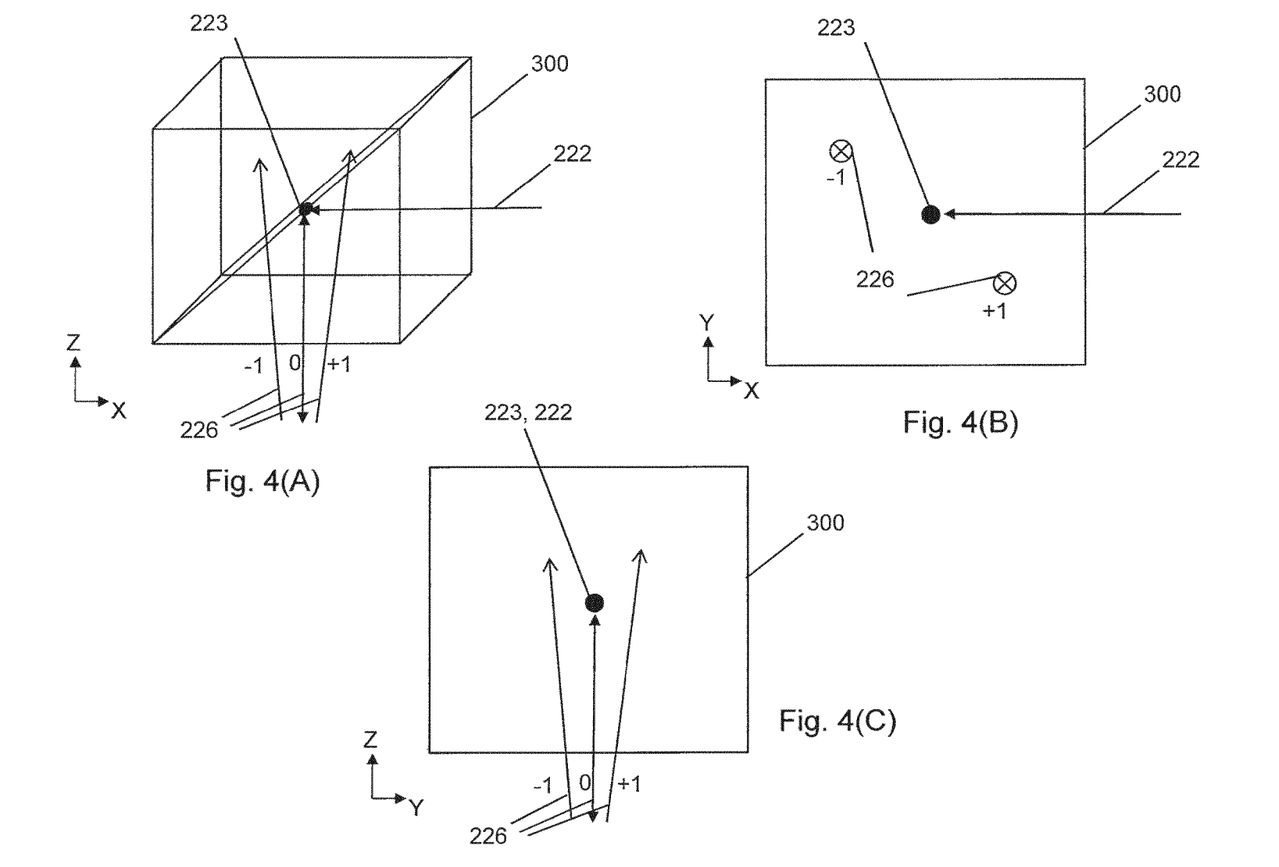
FIGS. 4(A), 4(B) and FIG. 4(C), is a schematic diagram of an embodiment of a stop of a measurement apparatus.

An embodiment of the spot mirror 223 is shown in FIGS. 4(A)-(C). The spot mirror 223 is part of, in or on a prism 300. In the embodiment shown in FIG. 4, the prism is in the form of a cube-type optical element comprising two wedges. However, one of the wedges is not necessary—in which case, the prism would be wedge shaped.

FIG. 4(A) is a schematic perspective view of the prism 300 showing the spot mirror 223 as well as the illumination beam 222 incident on the spot mirror 223 and various orders of the information-carrying beam 226, including the zeroth, +1, and −1 orders. As can be seen in FIG. 4(A), the spot mirror 223 acts as a stop for zeroth order radiation yet allows non-zero order radiation to pass. FIG. 4(B) is a schematic top view of prism 300 of FIG. 4(A). The illumination beam 222 can be seen as entering the prism 300 from the side and being incident on the spot mirror 223. Non-zero order radiation (arising from redirection by mark 202 (not shown for clarity purposes)) can be seen passing the spot mirror 223. FIG. 4(C) is a schematic side view of the right-hand side of prism 300 of FIG. 4(A). In FIG. 4(C), the illumination beam 222 comes out of the page and is incident on spot mirror 223. As can be seen in FIG. 4(C), the spot mirror 223 acts as a stop for zeroth order radiation yet allows non-zero order radiation to pass.

The spot mirror 223 is located at a diagonal face of at least one of the wedges. In FIG. 4, the spot mirror 223 is located at the juncture of diagonal faces of the wedges. For example, the spot mirror 223 may be a "silvered" portion of the diagonal face of one or both wedges.

Further, while FIG. 4 depicts the spot mirror 223 as having an oval or circular shape, it may have a different shape (e.g., rectangular, triangular, annular, etc.). Also, while just a single spot mirror 223 is shown in FIG. 4, there may be two or more spot mirrors 223 arranged at a diagonal face of a wedge. A plurality of spot mirrors 223 may be beneficial if the illumination beam has a multi-pole intensity distribution, i.e., each of the spot mirrors 223 arranged at the respective location of a pole of the illumination beam 222.

It has been discovered that spot mirror 223 does not block all of the zeroth order radiation from mark 202. While spot mirror 223 blocks a significant amount of zeroth order radiation, another part of the zeroth order may redirect from the mark 202 (e.g., reflect and/or diffract) and pass around the spot mirror 223 in the same general direction as the non-zero order radiation redirected by the mark 202. Further, in some cases, zeroth order radiation may pass through the body of the spot mirror 223; for example, zero order may pass through small holes in the mirror. Herein, zero order radiation passing the spot mirror 223 is radiation passing around the spot mirror 223, or radiation passing through the spot mirror 223, or both. Further, such radiation passing the spot mirror 223 will be referred to as leak zero order radiation.

Thus, in an embodiment, there may effectively be created a ring-shaped beam of leak zero order radiation in the information-carrying beam 226 beyond the spot mirror 223 when leak zero order radiation passes around the spot mirror 223. For example, where the spot mirror 223 has circular profile in the beam path (e.g., in order to have the circular profile in the beam path, the spot mirror 223 may actually have an oval shape along the diagonal face of the wedge shape), the leak zero order radiation may have an annular or donut shape beyond the spot mirror 223. Additionally or alternatively, where the leak zero order radiation passes through the spot mirror 223, there may effectively be created a low intensity field of continuous or discrete leak zero order radiation in the interior of information-carrying beam 226 beyond the spot mirror 223. The leak zero order radiation essentially contains no measurement signal and adds noise to the measurement system downstream. It is desirable to eliminate it.

In an embodiment, to eliminate much, if not all of, the leak zero radiation, at least two stops are provided, each arranged to block zero order radiation and to allow non-zero order radiation to pass. Thus, in an embodiment, the spot mirror 223, or a different stop if spot mirror 223 is not used as a stop, acts as a first stop for zero order radiation (while allowing non-zero order radiation to pass) and a further stop is provided to block zero order radiation that passes the first stop (while allowing non-zero order radiation to pass) acts as a second stop. In an embodiment, the combined operation of the first and second stops is to eliminate 95% or more of the zero order radiation, eliminate 98% or more of the zero order radiation, eliminate 99% or more of the zero order radiation, eliminate 99.5% or more of the zero order radiation, eliminate 99.9% or more of the zero order radiation, eliminate 99.95% of the zero order radiation, or eliminate 99.99% or more of the zero order radiation. In an embodiment, the second stop blocks 80% or more of the leak zero order radiation, blocks 90% or more of the leak zero order radiation, blocks 95% or more of the leak zero order radiation, blocks 98% or more of the leak zero order radiation, block 99% or more of the leak zero order radiation, or blocks 99.5% or more of the leak zero order radiation. In an embodiment, the combined operation of the first and second stops is to allow 95% or more of the non-zero order radiation to pass, allow 98% or more of the non-zero order radiation to pass, allow 99% or more of the non-zero order radiation to pass, allow 99.5% or more of the non-zero order radiation to pass, allow 99.9% or more of the non-zero order radiation to pass, allow 99.95% of the non-zero order radiation to pass, or allow 99.99% or more of the non-zero order radiation to pass.

FIG. 5 depicts an embodiment of first and second stops to block zero order radiation. In FIG. 5, the spot mirror 223 is used as first stop to block zero order radiation. A second stop is provided as a mechanical optical block 310. In an embodiment, the mechanical optical block is a dot provided as part of, in or on the prism 300. While block 310 is shown in FIG. 5 as circular, the block 310 may be a different shape in order to conform to the shape of the spot mirror 223. Additionally or alternatively, while block 310 is shown in FIG. 5 as continuous, the block 310 may be ring-shaped (e.g., annular) to conform with the shape of the leak zero order radiation.

In an embodiment, block 310 is opaque. In an embodiment, block 310 may be absorptive, i.e., it absorb 90% or more, 95% or more, 98% or more, 99% or more, or 99.5% or more of the zero order radiation blocked by the block 310. In an embodiment, the block 310 is reflective. In an embodiment, the block 310 reflects the zero order radiation blocked by block 310 toward spot mirror 223, which can then reflect the radiation out the side of a prism 300 or absorb the radiation.

In an embodiment, the block 310 is diffractive or diffusive (and thus may or may not be opaque). In an embodiment, the block 310 diffusively redirects (e.g., reflects and/or diffracts) the radiation (so as to, e.g., make the spot "white"). In an embodiment, the block 310 diffracts the zero order radiation out of the side of the path of the information-carrying beam 226 to a designated radiation dump or generally to a side wall of the apparatus.

Figures 5A, 5B, 5C:
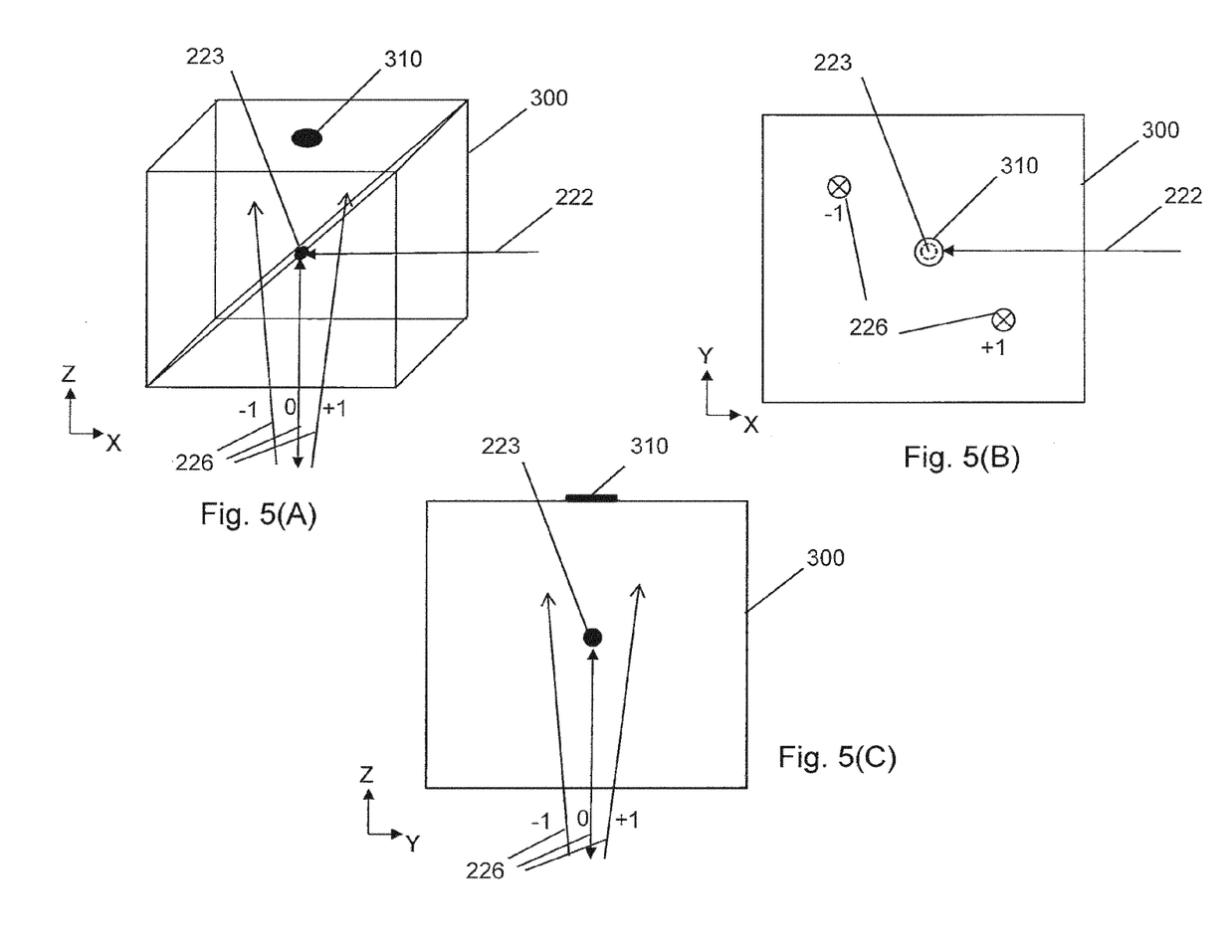
FIGS. 5(A), 5(B) and FIG. 5(C), is a schematic diagram of an embodiment of first and second stops of a measurement apparatus.

FIG. 5(A) is a schematic perspective view of the prism 300 showing the spot mirror 223, the block 310, the illumination beam 222 incident on the spot mirror 223, and various orders of the information-carrying beam 226, including the zeroth, +1, and −1 orders. As can be seen in FIG. 5(A), the spot mirror 223 acts as a stop for zeroth order radiation yet allows non-zero order radiation to pass. Further, block 310 acts as a stop for zeroth order radiation that passes spot mirror 223 yet allows non-zero order radiation to pass. FIG. 5(B) is a schematic top view of prism 300 of FIG. 5(A). The illumination beam 222 can be seen as entering the prism 300 from the side and being incident on the spot mirror 223. Non-zero order radiation (arising from redirection by mark 202 (not shown for clarity purposes)) can be seen passing the spot mirror 223. Further, some zero order radiation (not specifically identified for clarity purposes) passes spot mirror 223 and is blocked by block 310. The interior of block 310 is shown as empty in FIG. 5(B) merely in order to depict its relationship with spot mirror 223. In an embodiment, the block 310 in FIG. 5(B) would be solid. FIG. 5(C) is a schematic side view of the right-hand side of prism 300 of FIG. 5(A). In FIG. 5(C), the illumination beam 222 comes out of the page and is incident on spot mirror 223. As can be seen in FIG. 5(C), the spot mirror 223 acts as a stop for zeroth order radiation yet allows non-zero order radiation to pass. Further, some zero order radiation (not specifically identified for clarity purposes) passes spot mirror 223 and is blocked by block 310.

In an embodiment, the width of the profile of the block 310 in the beam path (as similarly discussed above with respect to the spot mirror 223, the profile of the block 310 in the beam path may be different than its actual shape if, for example, the block 310 crosses at least part of the beam path at a non-perpendicular angle to the beam path) is wider than the width of the profile of the spot mirror 223 in the beam path (as noted above, the spot mirror 223 may occupy a circular profile in the beam path but actually be of a different shape (e.g., oval shape)). In an embodiment, the width of the profile of the block 310 in the beam path is at least 101%, at least 102%, at least 105%, or at least 110% the width of the profile of the spot mirror 223 in the beam path. In an embodiment, the width of the profile of the block 310 in the beam path is less than or equal to 140%, less than or equal to 130%, less than or equal to 120%, or less than or equal to 115% the width of the profile of the spot mirror 223 in the beam path. If the block 310 is ring-shaped (e.g., annular), then an internal width of the profile of the block 310 in the beam path is smaller than the width of the profile of the spot mirror 223 in the beam path (as noted above, the spot mirror 223 may occupy a circular profile in the beam path but actually be of a different shape (e.g., oval shape)). In an embodiment, the interior width of a ring-shaped profile of the block 310 in the beam path is 99% or less, 97% or less, 95% or less, 90% or less or 85% or less of the width of the profile of the spot mirror 223 in the beam path.

In an embodiment, the width of the profile of the block 310 in the beam path may be the most, if not the entire, width of the beam path with one or more openings for the non-zero orders. For example, the block 310 may extend across the width of the beam path with openings at the locations where the non-zero orders will pass such as at 0°, +45°, +90°, +135°, +180°, +225°, +270° and +315° degrees.

In an embodiment, the block 310 may be part of, in or on the prism 300.

In an embodiment, the block 310 may be an opaque feature, such as a coating, a ball bearing or other opaque material or structure.

In an embodiment, the block 310 may be a reflective or scattering structure. A reflective block 310 may be a mirror, a reflective coating, etc. A scattering block 310 may mounted or engraved into on a surface (e.g. the surface of prism 300). Such a scattering block 310 may be ground into the surface (e.g., a glass plate surface). Such a scattering block 310 may be any material or structure that disperses the incident radiation, sending the radiation away from the detector. In an embodiment, the scattering block 310 may be a grating.

In an embodiment, the first stop and/or the second stop may be relatively permanently installed in the measurement apparatus. For example, the spot mirror 223 and/or the block 310 may be fixed in the measurement apparatus.

In an embodiment, the first stop and/or the second stop may be movable in and/or removable from the measurement apparatus. In an embodiment, the first stop and/or the second stop may be movable in and/or removable out of the beam path. Accordingly, in an embodiment, a measurement apparatus (e.g., an alignment sensor) where the spot mirror 223 is designed for large or maximum mark pitch range (e.g., as small as possible) can be easily converted to a measurement apparatus that is designed for low or minimum zero order leakage, by putting the block 310 in place. Once the block 310 is in place, the measurement apparatus can be easily reverted back to the original arrangement by moving the block 310 out of the optical path. Thus, the measurement apparatus may maintain compatibility with various measuring schemes (e.g., coarse alignment, fine alignment, overlay measurement, etc.), various setups (e.g., focus), etc. depending on whether the block 310 is in the optical path or not. For example, the measuring apparatus may remain compatible with a coarse alignment, focal or other setup currently in place for the measurement apparatus with the block 310 out of the optical path and then, where it is desired that zero order radiation is effectively completely blocked, the block 310 can be put into place by moving the block 310 into the optical path.

In an embodiment, because the block 310 is movable in and/or removable out of the beam path, the block 310 may be optimizes for a specific pitch of the measurement target used.

Figure 6:
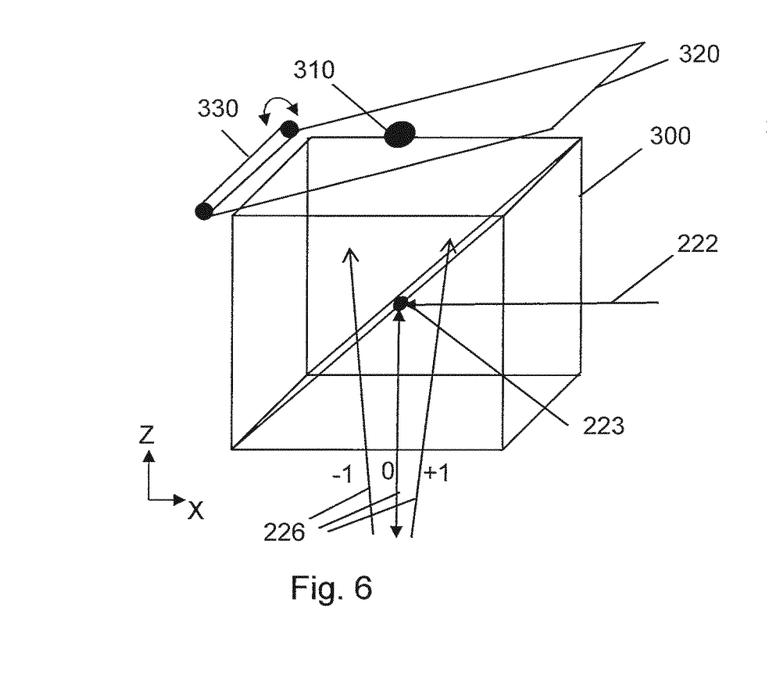
FIG. 6 is a schematic diagram of a stop being movable in and/or removable from the measurement apparatus.

FIG. 6 depicts an embodiment of the block 310 being movable in and/or removable from the measurement apparatus. In the embodiment of FIG. 6, block 310 is part of, in or on a transparent plate 320. In an embodiment, the plate 320 is glass, fused silica, or quartz. The plate 320 is connected to a hinge 330 such that the plate 320 (and the block 310) can be rotated about the hinge axis. In one position, the block 310 may be positioned into the optical path downstream from spot mirror 223 and in another position, the block 310 may be positioned out of the optical path. In an embodiment, the plate 320 may be rotated to a location on or near the top surface of prism 300. In an embodiment, the plate 320 may be removably connected or disconnected from hinge 330 so that, for example, different blocks 310 may be used.

Figure 7:
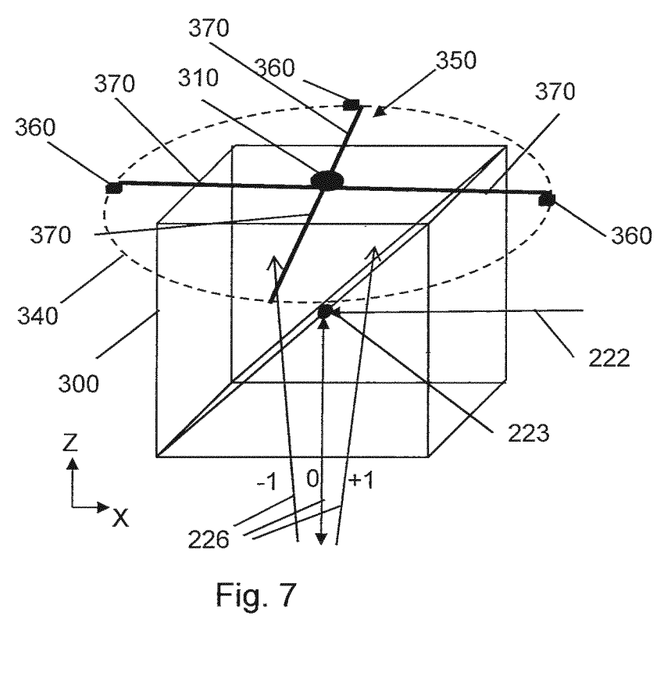
FIG. 7 is a schematic diagram of a stop being movable in and/or removable from the measurement apparatus.

FIG. 7 depicts a further embodiment of block 310 being movable in and/or removable from the apparatus. In the embodiment of FIG. 7, the block 310 is connected to a support arm structure 350 that, when the block 310 is installed in the measurement apparatus, extends to a support frame 340. The support frame 340 thus supports the block 310 via the support arm structure 350. In an embodiment, the support arm structure comprises two, four or eight arms 370 to position the block 310 in the appropriate position. However, a different number of arms may be used, i.e., one or more arms may be used. The one or more arms of the support arm structure 350 may be thin enough not to substantially impair the radiation or the non-zero order radiation may be appropriately angled to miss the one or more arms of the support arm structure 350 while still passing through the support arm structure 350. In an embodiment, the eight arms are used so that optical impact (if any at all) of the arms is symmetrical. In an embodiment, one or more arms may be non-supporting while one or more other arms may be supporting. For example, in the eight arm example, five arms could be non-supporting and three arms are supporting such that a stable mechanical 3-arm structure is provided combined with the eight arm symmetric optical impact.

The support arm structure 350 may loosely sit on the frame 340 or be clamped thereto. One or more stops 360 may be provided to mechanically prevent the support arm structure 350 from substantially displacing in the X and Y directions or substantially rotating around the Z direction. The frame 340 prevents substantial rotation around the X and Y axes and constrains movement in the downward Z direction. The support arm structure 350 and the block 310 may be removed by hand or by an automatic tool, e.g., a handling robot. In an embodiment, the non-zero order radiation is arranged to pass through the support arm structure 350. Through the support arm structure 350, different types and/or sizes of block 310 may introduced into the optical path.

Figure 8:
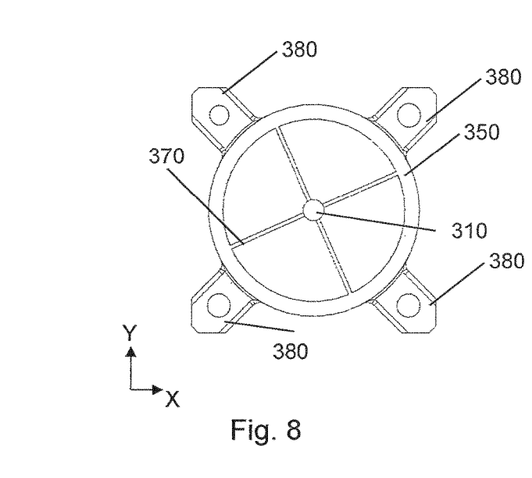
FIG. 8 is a schematic bottom view diagram of a stop being movable in and/or removable from the measurement apparatus.
Figure 9:
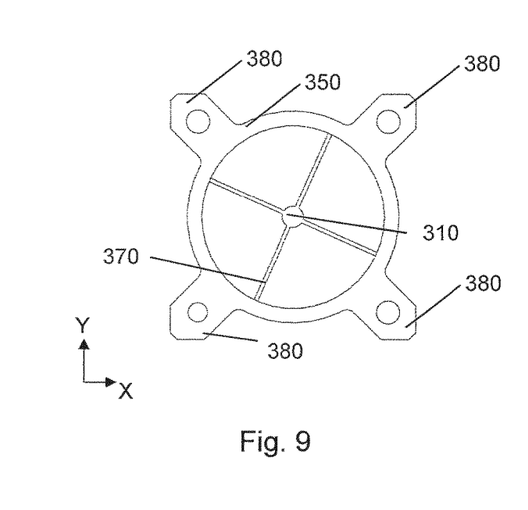
FIG. 9 is a schematic top view diagram of the stop of FIG. 8.
Figure 10:
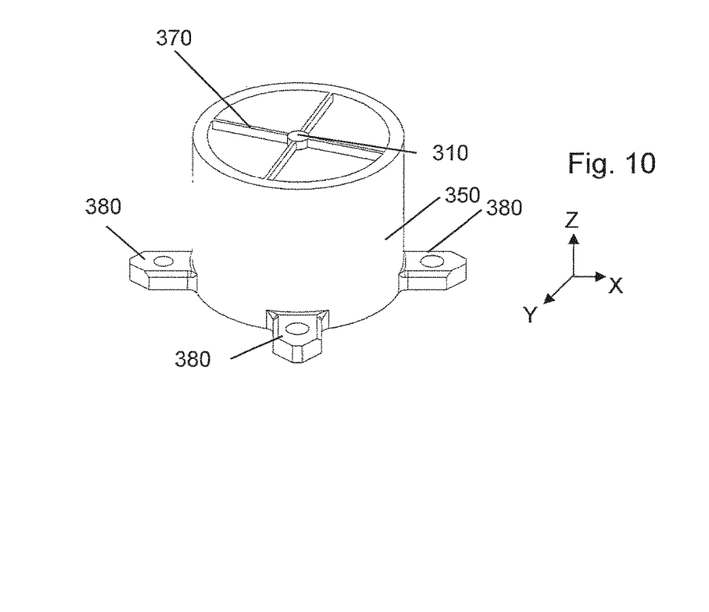
FIG. 10 is a schematic side view diagram of the stop of FIG. 8 showing the side and outside bottom of the stop.
Figure 11:
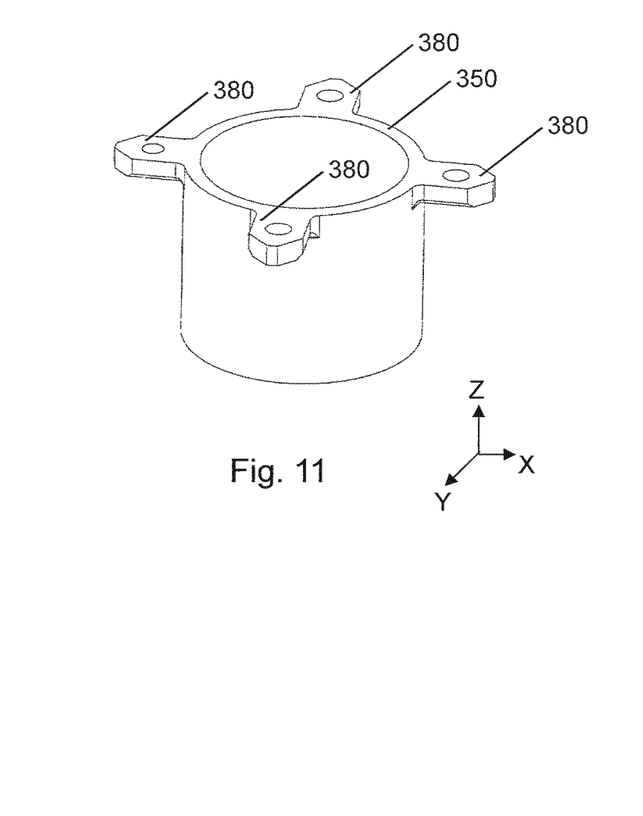
FIG. 11 is a schematic side view diagram of the stop of FIG. 8 showing the side and outside top of the stop.
Figure 12:
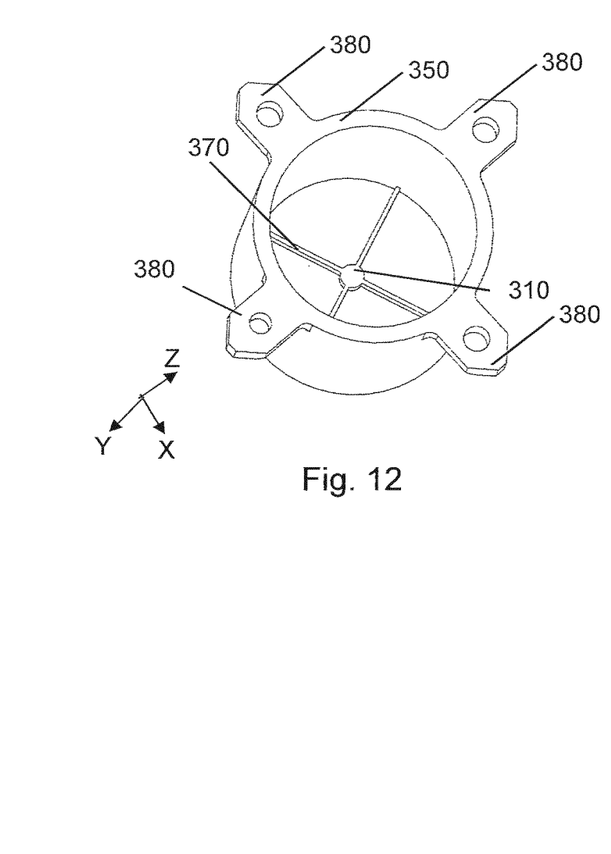
FIG. 12 is a schematic inside view diagram of the stop of FIG. 8 showing the side, the outside top and the inside bottom of stop.

FIG. 8 is a schematic bottom view diagram of a stop being movable in and/or removable from the measurement apparatus. This stop is similar to the design of FIG. 7. As can be seen, block 310 is part of or mounted on a support arm structure 350. In this embodiment, the support arm structure 350 has four arms 370. The bottom of support arm structure 350 would be in an embodiment nearest the prism 300 and so the support frame 340 (not shown in FIG. 8 for clarity) would be displaced from the prism 300 such that the barrel of the support arm structure would "hang" down from the support frame 340 surface onto which the support arm structure 350 is mounted. In an embodiment, the support arm structure has one or more projections 380 to engage with the support frame 340. In an embodiment, one or more of the one or more projections 380 may have a hole to engage with one or more stops 360. In an embodiment, the one or more stops 360 may be screws or bolts running through the hole(s) of the projection(s) 380. FIG. 9 is a schematic top view diagram of the stop of FIG. 8. FIG. 10 is a schematic side view diagram of the stop of FIG. 8 showing the side and outside bottom of the stop. FIG. 11 is a schematic side view diagram of the stop of FIG. 8 showing the side and outside top of the stop. FIG. 12 is a schematic inside view diagram of the stop of FIG. 8 showing the side, the outside top and the inside bottom of stop.

Other mechanisms for selectively having the block 310 in the optical path may be used. For example, the block 310 may be mounted on a horizontally or vertically rotating structure that selectively rotates the block 310 into the path. In a further embodiment, the apparatus may have an electroactive device, e.g., a spatial light modulator with movable elements or a liquid crystal type device. The device may have, in one state, the elements thereof arranged so that the device is transparent across the optical path and in another state, the elements thereof selectively arranged so that it forms block 310 in the optical path.

Further, in an embodiment, the block 310 may not be part of, in or on the prism 300. In an embodiment, the second stop may be somewhere between the first stop and the detector. In an embodiment, the block 310 may be downstream of the spot mirror 223. For example, the block 310 may be located between the spot mirror 223 and the interferometer 228, be part of, in, or on the interferometer 228, or be between the interferometer 228 and the sensor 230.

In an embodiment, the spot mirror 223 acts as the second stop and the block 310, located between the spot mirror 223 and the mark 202, acts as the first stop. For example, the block 310 may be located on or at the bottom surface of prism 300 shown in FIG. 5(A). In that case, the block 310 may be ring-shaped in order to allow the illumination beam to pass through its interior to the mark 202. The width of the profile of the block 310 in the beam path would be wider than the width of the profile of the spot mirror 223 in the beam path. Moreover, the interior width of the ring-shaped profile of the block 31 in the beam path would be equal to or slightly smaller than the width of the profile of the spot mirror 223 in the beam path to minimize the redirection of illumination radiation before it is incident on the mark.

In an embodiment, referring to FIG. 4(c), the illumination beam 222 incident on the spot mirror 223 may have a larger cross-section than the cross-section of the spot mirror 223 in the beam path of the illumination beam 222. Accordingly, some, if not most, radiation of illumination beam 222 is reflected by spot mirror 223 and other radiation will pass the spot mirror 223 to, for example, the opposite side surface of the prism 300 into which the illumination beam 222 was incident to the prism 300. The radiation that passes the spot mirror 223 in this manner may be used to diagnose one or more optical components of the measurement apparatus. For example, a detector may receive such radiation that passes the spot mirror 223 and determine from the amount, the shape, the position, etc. of such radiation whether one or more upstream components (e.g., the radiation source, the spot mirror 223, etc.) are improperly positioned or not properly operating. An action, such an alignment operation, may then be performed depending on the results. So, making the spot mirror 223 larger with the aim to reduce or eliminate leak zero order radiation could preclude such a measurement technique. Accordingly, use of second stop as described herein may have little to no impact on an existing diagnosis (e.g., alignment) technique of the measurement apparatus.

In an embodiment, the optical system of the measurement apparatus may use off-axis illumination to illuminate the mark. By off-axis illumination, it is meant that one or more source regions of radiation are confined to a peripheral portion of the pupil, that is to say, some distance away from the optical axis (e.g. dipole illumination, annular illumination, quadrupole illumination, etc.). Confining the illumination to a periphery of the pupil reduces the smallest possible pitch of the mark from substantially $\lambda/NA$ to substantially $\lambda/2NA$, where $\lambda$ is the wavelength of radiation used, and NA is the numerical aperture of an objective lens of the instrument (e.g. the alignment sensor or more generally the position measurement apparatus). For example, off-axis illumination may be used at a limited range of incidence angles (limited radial extent in the pupil plane). By use of off-axis illumination, among other things, the grating pitch of a mark can be reduced for greater accuracy and optionally, without the need for spatial resolution on the detector side of the measurement apparatus. Illumination optics to provide the off-axis illumination can take various forms, some of which are disclosed in PCT Patent Application Publication Nos. WO 2013/152878 and WO 2014/026819, which are incorporated herein by reference in their entireties.

Thus, in an embodiment, the illumination optics is configured to supply coherent radiation from at least first and second source regions within a pupil of the objective lens 224. The first and second regions are confined to a peripheral portion of the pupil (in the sense of at least being away from the optical axis). They are each limited in angular extent and are positioned diametrically opposite one another with respect to the optical axis. The source regions may take the form of very small spots, or may be more extended in form. Further source regions may be provided, in particular third and fourth source regions may be provided rotated at 90° from the first and second regions. The apparatus as a whole need not be limited to providing these particular illumination profiles. It may have other modes of use, both known or yet to be developed, which favor the use of different profiles.

In an embodiment, the optical system of the measurement apparatus is selectively operable between an on-axis illumination mode in which the spot is formed by a beam radiation aligned with an optical axis of the optical system and an off-axis mode of illumination in which the spot is formed by one or beams of radiation incident from a direction away from an optical axis of the optical system (e.g. dipole illumination, annular illumination, quadrupole illumination, etc.).

In an embodiment, the off-axis illumination may be created by a particular distribution or location of one or more spot mirrors of the apparatus, which can both provide the desired illumination and act as a field stop for zero order diffracted radiation. For example, the incident beam may be wider than the width of the respective one or more spot mirrors and so a portion of the beam is delivered by the one of more spot mirrors to the mark while the remainder passes beyond the one or more spot mirrors to be incident on, for example, a beam dump.

In an embodiment, the on-axis illumination and/or off-axis illumination may be defined prior to incidence on one or more spot mirrors 223. The on-axis illumination and/or off-axis illumination may be created by a customized optical element, by a spatial light modulator with movable elements, etc. The illumination could be matched with the one or more spot mirrors 223 so as to provide the desired illumination profile at the pupil plane of objective lens 224 without significant waste of radiation.

A 'universal' illumination profile can be designed that allows for aligning on any of the X, Y and XY marks without changing the illumination mode, although this inevitably brings some compromise in performance and/or some complication in the apparatus. Alternatively, dedicated modes can be designed and made to be selectable for use with the different mark types (e.g., by changing the spot mirror arrangement and/or changing the input radiation distribution). Different polarizations of illumination can be selected also.

In an embodiment, the optical system is configured to allow scatterometry type measurements to be performed with the measurement apparatus. For example, a detector having spatial resolution in a conjugate pupil plane can be used, to allow angle-resolved scatterometry methods to be performed using the measurement apparatus.

The mark may need to be scanned more than once if it is desired, for example, to measure position using two different polarizations. Also it may be useful to switch the illumination mode midway through scanning the XY mark. In other embodiments, multiplexing of optical signals can be used so that two measurements can be made simultaneously. Similarly, multiplexing can be applied so that different portions of the XY mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at the detector will be a mixture of two signals, but they can be separated electronically using one or more filters tuned to the respective frequencies of the source radiation. Time division multiplexing could also be used, but this would tend to involve accurate synchronization between source and detector. The modulation at each frequency can be a simple sine or square wave, for example.

It should be noted that in the examples described above, one or more polarizing elements that are typically used in an optical path of the measurement apparatus have been omitted. This is only done to simplify the explanation of the description of embodiments of the invention. In a real implementation one or more polarizing elements would typically be included. One or more of the stops described herein may be part of, in, or on such a polarizing element. Additionally, it is customary to make measurements with different polarizations according to the mark type, and/or to make measurements with more than one polarization on each mark. The features to achieve desired polarizations can be envisaged by the skilled person.

If it is desired to illuminate a mark with circular polarization, whether for position sensing or some other form of metrology, a quarter wave plate (not shown) can be inserted between spot mirror 223 and objective 224. This has the effect of turning a linear polarization into a circular one (and changing it back again after diffraction by the mark). The direction of circular polarization (clockwise/counterclockwise) can be changed by selecting a different linear polarization in the illumination output 220 or other optics between illumination output and spot mirror 223.

In an embodiment, a polarizing element may be located between spot mirror 223 and the detector. For example, a polarizing element, e.g., in the form of a quarter wave or half wave plate, may be located at or on the top of prism 300. In an embodiment, the block 310 may be provided as part of, in or on such a polarizing element, e.g., the top of such a polarizing element.

The illumination emerging from the illumination output 220 may be monochromatic but is typically broadband in nature, for example white light, or polychromatic. A diversity of wavelengths in the beam increases the robustness of the measurement. The sensor may use for example a set of four wavelengths named green, red, near infrared and far infrared. A different four wavelengths, or more or fewer than four wavelengths, might be used.

The phrase "positive and negative diffraction orders" in this specification refers to any of the $1^{st}$ and higher diffraction orders. Diffraction orders include zeroth order (specular reflection) which is neither positive nor negative, and then higher orders which exist in complementary pairs, conveniently referred to as positive and negative. Non-zero orders can be referred to as higher orders. Thus, $+1^{st}$ order and $-1^{st}$ order are examples of positive and negative orders, as are $+2^{nd}$ and $-2^{nd}$, $+3^{rd}$ and $3^{rd}$ and so forth. The examples herein are, for convenience, illustrated primarily with reference to $+1^{st}$ and $-1^{st}$ orders, but without limitation that other non-zero orders may be transmitted and/or processed. In other words, while the examples described herein concentrate on $0^{th}$ order and $+/-1^{st}$ order diffraction signals, it will be understood that the disclosure extends to the capture and analysis of higher orders, for example $+/-2^{nd}$ orders, more generally $+/-n^{th}$ orders. In the examples, the $1^{st}$ orders only are shown and discussed, for simplicity.

References herein to top, bottom and side are for convenience only. Items referenced herein may be oriented different as described. For example, items arranged vertically may be arranged horizontally or may be arranged upside down from what was described. So, in appropriate circumstances, descriptions of something being at or on the top of an item may be at the side or bottom of that item depending on the orientation of that item.

While the description and claims refer to a spot of radiation as being formed on the structure that forms, e.g., the alignment mark, the term "spot" is not to be understood as requiring any particular size or shape of illuminated area. The illumination spot may be round or elongated, for example. Similarly, while an image of the spot may be formed to fall on one or more detectors, the image of the spot may or may not have the same shape as the spot itself. Multiple spots with respective detectors are not excluded.

It should be understood that the processing unit PU which controls alignment sensor, processes signals detected by it, and calculates from these signals position measurements suitable for use in controlling the lithographic patterning process, will typically involve a computer assembly of some kind. The computer assembly may be a dedicated computer external to the apparatus, it may be a processing unit or units dedicated to the alignment sensor or, alternatively, it may be a central control unit LACU controlling the lithographic apparatus as a whole. The computer assembly may be arranged to load a computer program product comprising computer executable code. This may enable the computer assembly, when the computer program product is downloaded, to control the aforementioned uses of a lithographic apparatus with the alignment sensor AS.

In an embodiment, there is provided a measurement apparatus comprising: an optical system to provide illumination radiation into a spot on a periodic structure and to receive radiation redirected by the periodic structure, the optical system comprising: a first stop to block zero order radiation from the periodic structure and allow non-zero order radiation to pass, and a second stop to block zero order radiation passing the first stop and to allow the non-zero order radiation to pass; and a radiation detector, downstream of the optical system, to receive the non-zero order radiation.

In an embodiment, the first stop comprises a mirror. In an embodiment, the measurement apparatus further comprises a radiation input to provide the illumination radiation to the mirror, the mirror configured to provide the illumination radiation toward the spot on the periodic structure. In an embodiment, the first stop is part of, in, or on a prism. In an embodiment, the second stop is part of, in, or on the prism. In an embodiment, the second stop is part of, in, or on a prism. In an embodiment, the second stop is a part of, in, or on a plate. In an embodiment, the plate is mounted on a hinge. In an embodiment, the second stop is a part of, in, or on a support arm structure that is releasably supported by a frame. In an embodiment, the second stop is an opaque feature. In an embodiment, the second stop is a scattering or reflective feature. In an embodiment, the second stop is movable into and out of the path of the redirected radiation.

In an embodiment, the detector is configured to determine alignment from the received non-zero order radiation.

In an embodiment, there is provided a lithographic apparatus comprising: a patterning subsystem configured to transfer a pattern to a substrate; a measuring subsystem configured to measure a position of the substrate in relation to the patterning subsystem, wherein the patterning subsystem is arranged to use the position measured by the measuring subsystem to apply the pattern at a desired position on the substrate and wherein the measuring subsystem comprises an apparatus as described herein.

In an embodiment, there is provide a method of measuring, the method comprising: providing radiation into a spot on a periodic structure; receiving radiation redirected by the periodic structure, the redirected radiation including zero order and non-zero order radiation; blocking zero order radiation of the redirected radiation using a first stop, while allowing non-zero order radiation to pass the first stop; blocking zero order radiation passing the first stop using a second stop, while allowing non-zero order radiation to pass the second stop; and receiving the non-zero order radiation at a radiation detector downstream of the first and second stops.

In an embodiment, the first stop comprises a mirror and further comprising providing illumination radiation to the mirror, the mirror providing the illumination radiation toward the spot on the periodic structure. In an embodiment, the first stop is part of, in, or on a prism. In an embodiment, the second stop is part of, in, or on the prism. In an embodiment, the second stop is part of, in, or on a prism. In an embodiment, the method further comprises moving the second stop into and out of the path of the redirected radiation. In an embodiment, the second stop is a part of, in, or on a plate mounted on a hinge and wherein moving the second stop comprises rotating the plate about the hinge. In an embodiment, the second stop is a part of, in, or on a support arm structure that is releasably supported by a frame. In an embodiment, the second stop is a scattering or reflective feature.

In an embodiment, there is provided a method of manufacturing a device wherein a device pattern is applied to a substrate using a lithographic process, the method including positioning the applied pattern by reference to a measured position of a periodic structure formed on the substrate, the measured position being obtained by a method as claimed herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that an embodiment of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

An embodiment of the invention may take the form of a computer program containing one or more sequences of machine-readable instructions describing a method as disclosed above, or a data storage medium (e.g. semiconductor memory, magnetic or optical disk) having such a computer program stored therein.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A measurement apparatus comprising:
   an optical system to provide illumination radiation into a spot on a periodic structure and to receive radiation redirected by the periodic structure, the optical system comprising:
   a first stop to block zero order radiation from the periodic structure and allow non-zero order radiation to pass; and
   a second stop to block zero order radiation passing the first stop and to allow the non-zero order radiation to pass; and
   a radiation detector, downstream of the optical system, to receive the non-zero order radiation.

2. The measurement apparatus of claim 1, wherein the first stop comprises a mirror.

3. The measurement apparatus of claim 2, further comprising a radiation input to provide the illumination radiation to the mirror, the mirror configured to provide the illumination radiation toward the spot on the periodic structure.

4. The measurement apparatus of claim 1, wherein the first stop is part of, in, or on a prism.

5. The measurement apparatus of claim 4, wherein the second stop is part of, in, or on the prism.

6. The measurement apparatus of claim 1, wherein the second stop is part of, in, or on a prism.

7. The measurement apparatus of claim 1, wherein the second stop is a part of, in, or on a plate.

8. The measurement apparatus of claim 7, wherein the plate is mounted on a hinge.

9. The measurement apparatus of claim 1, wherein the second stop is a part of, in, or on a support arm structure that is releasably supported by a frame.

10. The measurement apparatus of claim 1, wherein the second stop is an opaque feature.

11. The measurement apparatus of claim 1, wherein the second stop is a scattering or reflective feature.

12. The measurement apparatus of claim 1, wherein the second stop is movable into and out of the path of the redirected radiation.

13. The measurement apparatus of claim 1, wherein the detector is configured to determine alignment from the received non-zero order radiation.

14. A lithographic apparatus comprising:
    a patterning subsystem configured to transfer a pattern to a substrate;
    a measuring subsystem configured to measure a position of the substrate in relation to the patterning subsystem,
    wherein the patterning subsystem is arranged to use the position measured by the measuring subsystem to apply the pattern at a desired position on the substrate and wherein the measuring subsystem comprises the apparatus as claimed in claim 1.

15. A method of measuring, the method comprising:
    providing radiation into a spot on a periodic structure;
    receiving radiation redirected by the periodic structure, the redirected radiation including zero order and non-zero order radiation;
    blocking zero order radiation of the redirected radiation using a first stop, while allowing non-zero order radiation to pass the first stop;
    blocking zero order radiation passing the first stop using a second stop, while allowing non-zero order radiation to pass the second stop; and
    receiving the non-zero order radiation at a radiation detector downstream of the first and second stops.

16. The method of claim 15, wherein the first stop comprises a mirror and further comprising providing illumination radiation to the mirror, the mirror providing the illumination radiation toward the spot on the periodic structure.

17. The method of claim 15, wherein the first stop is part of, in, or on a prism.

18. The method of claim 17, wherein the second stop is part of, in, or on the prism.

19. The method of claim 15, wherein the second stop is part of, in, or on a prism.

20. The method of claim 15, further comprising moving the second stop into and out of the path of the redirected radiation.

21. The method of claim 20, wherein the second stop is a part of, in, or on a plate mounted on a hinge and wherein moving the second stop comprises rotating the plate about the hinge.

22. The method of claim 20, wherein the second stop is a part of, in, or on a support arm structure that is releasably supported by a frame.

23. The method of claim 15, wherein the second stop is a scattering or reflective feature.

24. A method of manufacturing a device wherein a device pattern is applied to a substrate using a lithographic process, the method including positioning the applied pattern by reference to a measured position of a periodic structure formed on the substrate, the measured position being obtained by the method as claimed in claim 15.

* * * * *

UNITED STATES PATENT AND TRADEMARK OFFICE
CERTIFICATE OF CORRECTION

PATENT NO.         : 9,891,540 B2                                    Page 1 of 1
APPLICATION NO.    : 15/504621
DATED              : February 13, 2018
INVENTOR(S)        : Earl William Ebert et al.

It is certified that error appears in the above-identified patent and that said Letters Patent is hereby corrected as shown below:

On the Title Page

Item (72) Inventors:
Replace "Earl William EBERT, Wilton, CT (US)
Franciscus Godefridus Casper BIJNEN, Veldhoven, (NL)"
With --Earl William EBERT, Oxford, CT (US)
Franciscus Godefridus Casper BIJNEN, Valkenswaard, (NL)--.

Item (56) References Cited - Other Publications:
After "International Search Report and Written Opinion dated Sep. 25, 2015 in corresponding
International Patent Application No. PCT/EP2015/061928."
Insert --Chinese Office Action issued November 29, 2017 in corresponding Chinese Patent
Application No. 201580045832.8.--.

On Page 2, Item (56) References Cited - U.S. Patent Documents:
Before "8,208,121 06/2012 Bijnen et al."
Insert --6,967,712 11/2005 Sewell--.

On Page 2, Item (56) References Cited - Foreign Patent Documents:
After "WO 2014/026819 02/2014"
Insert --CN 101114134 01/2008
CN 1453635 11/2003
CN 102495536 06/2012
CN 104345571 02/2015
JP 2006-53056 02/2006--.

Signed and Sealed this
Nineteenth Day of June, 2018

Andrei Iancu
*Director of the United States Patent and Trademark Office*